US012691549B2

(12) United States Patent
Lim

(10) Patent No.: US 12,691,549 B2
(45) Date of Patent: Jul. 28, 2026

(54) METHOD FOR DISCRIMINATING WAFER REGION AND WAFER REGION DISCRIMINATION APPARATUS FOR PERFORMING THE SAME

(71) Applicant: KCTECH CO., LTD., Gyeonggi-do (KR)

(72) Inventor: Ho Kyun Lim, Seoul (KR)

(73) Assignee: KCTECH CO., LTD., Gyeonggi-do (KR)

( * ) Notice: Subject to any disclaimer, the term of this patent is extended or adjusted under 35 U.S.C. 154(b) by 379 days.

(21) Appl. No.: 18/469,542

(22) Filed: Sep. 18, 2023

(65) Prior Publication Data

US 2024/0375242 A1    Nov. 14, 2024

(30) Foreign Application Priority Data

May 9, 2023    (KR) ........................ 10-2023-0059651

(51) Int. Cl.
| | |
|---|---|
| *B24B 49/12* | (2006.01) |
| *B24B 49/06* | (2006.01) |
| *H10P 74/20* | (2026.01) |

(52) U.S. Cl.
CPC .............. *B24B 49/12* (2013.01); *B24B 49/06* (2013.01); *H10P 74/203* (2026.01)

(58) Field of Classification Search
None
See application file for complete search history.

(56) References Cited

U.S. PATENT DOCUMENTS

| | | | | |
|---|---|---|---|---|
| 6,489,624 | B1 * | 12/2002 | Ushio | ................ G01B 11/0683 |
| | | | | 451/6 |
| 7,153,185 | B1 * | 12/2006 | Birang | .................... B24B 49/12 |
| | | | | 451/6 |
| 7,602,960 | B2 * | 10/2009 | Bartov | ............... G01N 21/9501 |
| | | | | 216/85 |
| 2005/0174584 | A1 * | 8/2005 | Chalmers | ............ G03F 7/70483 |
| | | | | 356/630 |
| 2012/0120758 | A1 * | 5/2012 | Cohn | ................ H01L 21/76843 |
| | | | | 367/87 |
| 2019/0181062 | A1 * | 6/2019 | Park | ........................ H01L 22/26 |
| 2023/0335374 | A1 * | 10/2023 | Gaury | ................ G01N 23/2251 |
| 2024/0413131 | A1 * | 12/2024 | Vertommen | ........... H10H 20/01 |

* cited by examiner

*Primary Examiner* — Helen Zong
(74) *Attorney, Agent, or Firm* — JCIPRNET

(57) ABSTRACT

A method of discrimination a wafer region and a wafer region discrimination apparatus performing the same are disclosed. A wafer region discrimination apparatus includes a probe including an optical sensor and configured to obtain optical spectrum signals of which signal values vary based on a thickness characteristic of a wafer at a plurality of positions on the wafer and a processor configured to identify whether a current optical spectrum signal is obtained from a die region on the wafer in which a chip is disposed using a region discrimination model based on a neural network that uses the current optical spectrum signal obtained by the probe as an input.

15 Claims, 11 Drawing Sheets

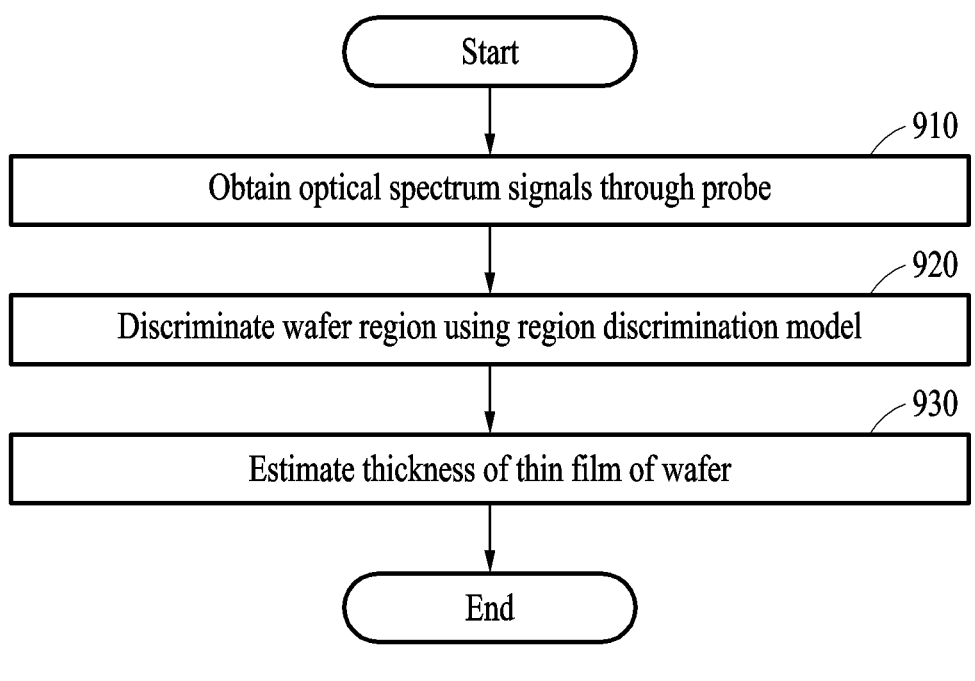

910 — Obtain optical spectrum signals through probe

920 — Discriminate wafer region using region discrimination model

930 — Estimate thickness of thin film of wafer

FIG. 9

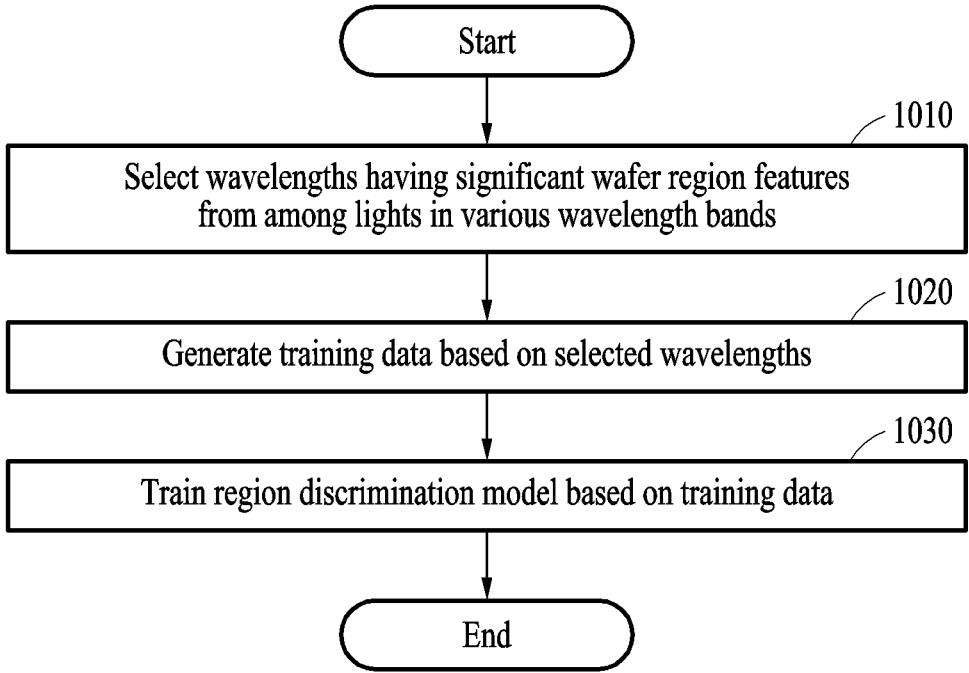

1010 — Select wavelengths having significant wafer region features from among lights in various wavelength bands 1020 — Generate training data based on selected wavelengths 1030 — Train region discrimination model based on training data

FIG. 10

METHOD FOR DISCRIMINATING WAFER REGION AND WAFER REGION DISCRIMINATION APPARATUS FOR PERFORMING THE SAME

CROSS-REFERENCE TO RELATED APPLICATION

This application claims the benefit of Korean Patent Application No. 10-2023-0059651 filed on May 9, 2023, in the Korean Intellectual Property Office, the entire disclosure of which is incorporated herein by reference for all purposes.

BACKGROUND

1. Field of the Invention

One or more embodiments relate to a technique for identifying a wafer area and a technique for estimating the thickness of a wafer.

2. Description of the Related Art

Generally, the chemical mechanical polishing (CMP) process is known as a standard process of polishing surfaces of wafers used to manufacture semiconductors including polishing layers through the relative rotation between a wafer and a polishing surface plate. A polishing apparatus for performing the CMP process includes a polishing surface plate with a polishing pad attached to the top surface of the polishing surface plate, a polishing head having a wafer to be polished mounted and rotating while in contact with the top surface of the polishing pad, and a conditioner that applies predetermined pressure to the surface of the polishing pad and finely cuts the surface of the polishing pad in order to reveal micropores formed on the surface of the polishing pad. In order to determine polishing-related parameters applied during the wafer polishing process, it is crucial to accurately measure or estimate the current thickness of the wafer.

SUMMARY

According to an aspect, there is provided a wafer region discrimination apparatus including a probe including an optical sensor and configured to obtain optical spectrum signals of which signal values vary based on a thickness characteristic of a wafer at a plurality of positions on the wafer and a processor configured to identify whether a current optical spectrum signal is obtained from a die region on the wafer in which a chip is disposed using a region discrimination model based on a neural network that uses the current optical spectrum signal obtained by the probe as an input.

The processor may be configured to identify whether the current optical spectrum signal is obtained from a non-die region on the wafer in which the chip is not disposed using the region discrimination model.

The non-die region may include at least one of an edge region in the wafer in which the chip is not disposed and a scribe line region between die regions.

The processor may be configured to identify whether the current optical spectrum signal is obtained from a region corresponding to a wafer ring frame for fixing the wafer using the region discrimination model.

The processor may be configured to identify whether the current optical spectrum signal is obtained from an air region outside the wafer ring frame using the region discrimination model.

The processor may be configured to estimate a thickness of a thin film of the wafer based on the current optical spectrum signal when it is determined that the current optical spectrum signal is obtained from the die region.

The processor may be configured to estimate the thickness of the thin film of the wafer using a wafer thickness estimation model based on a neural network that uses the current optical spectrum signal as an input.

The processor may be configured to discriminate a type of a region corresponding to each of the positions of the wafer using the plurality of optical spectrum signals and the region discrimination model.

The optical spectrum signals obtained by the probe may include signals obtained as light in a plurality of wavelength bands reflects off the wafer.

The region discrimination model may be configured to discriminate a first signal region corresponding to a die region and a second signal region corresponding to a non-die region from a signal of a predetermined wavelength extracted from optical spectrum signals obtained along a movement trajectory of the probe.

The region discrimination model may be a region discrimination model based on a convolutional neural network.

According to another aspect, there is provided a method of discriminating a wafer region including obtaining optical spectrum signals of which signal values vary based on a thickness characteristic of a wafer at a plurality of positions on the wafer through a probe and identifying whether a current optical spectrum signal is obtained from a die region on the wafer in which a chip is disposed using a region discrimination model based on a neural network that uses the current optical spectrum signal obtained by the probe as an input.

The identifying of whether the current optical spectrum signal is obtained from the die region on the wafer in which the chip is disposed may include identifying whether the current optical spectrum signal is obtained from a non-die region on the wafer in which the chip is not disposed using the region discrimination model.

The identifying of whether the current optical spectrum signal is obtained from the die region on the wafer in which the chip is disposed may include identifying whether the current optical spectrum signal is obtained from a region corresponding to a wafer ring frame for fixing the wafer using the region discrimination model.

The identifying of whether the current optical spectrum signal is obtained from the die region on the wafer in which the chip is disposed may include identifying whether the current optical spectrum signal is obtained from an air region outside the wafer ring frame using the region discrimination model.

The method may further include estimating a thickness of a thin film of the wafer based on the current optical spectrum signal when it is determined that the current optical spectrum signal is obtained from the die region.

Additional aspects of embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appre-

Figure 1:
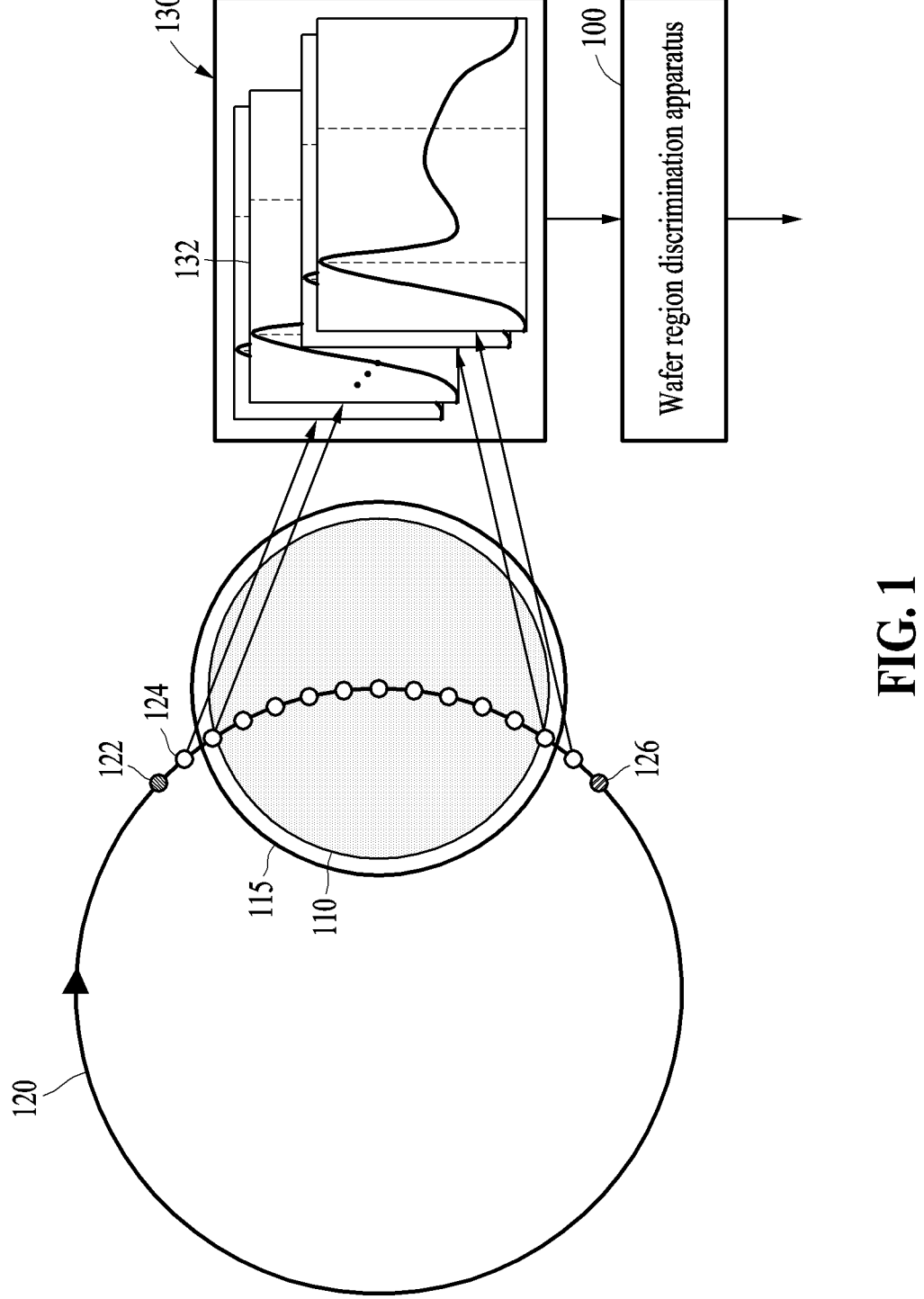
Figure 2:
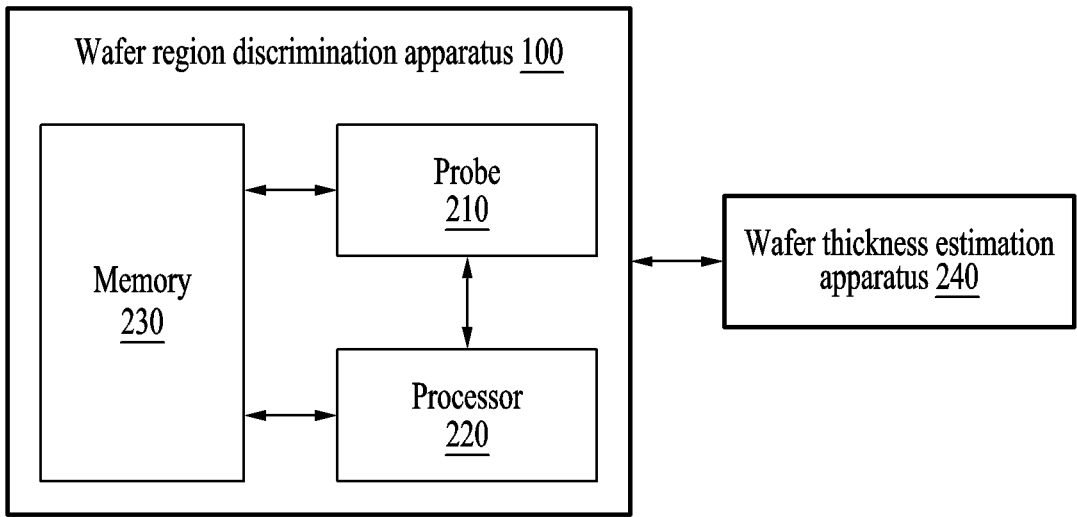
Figure 3:
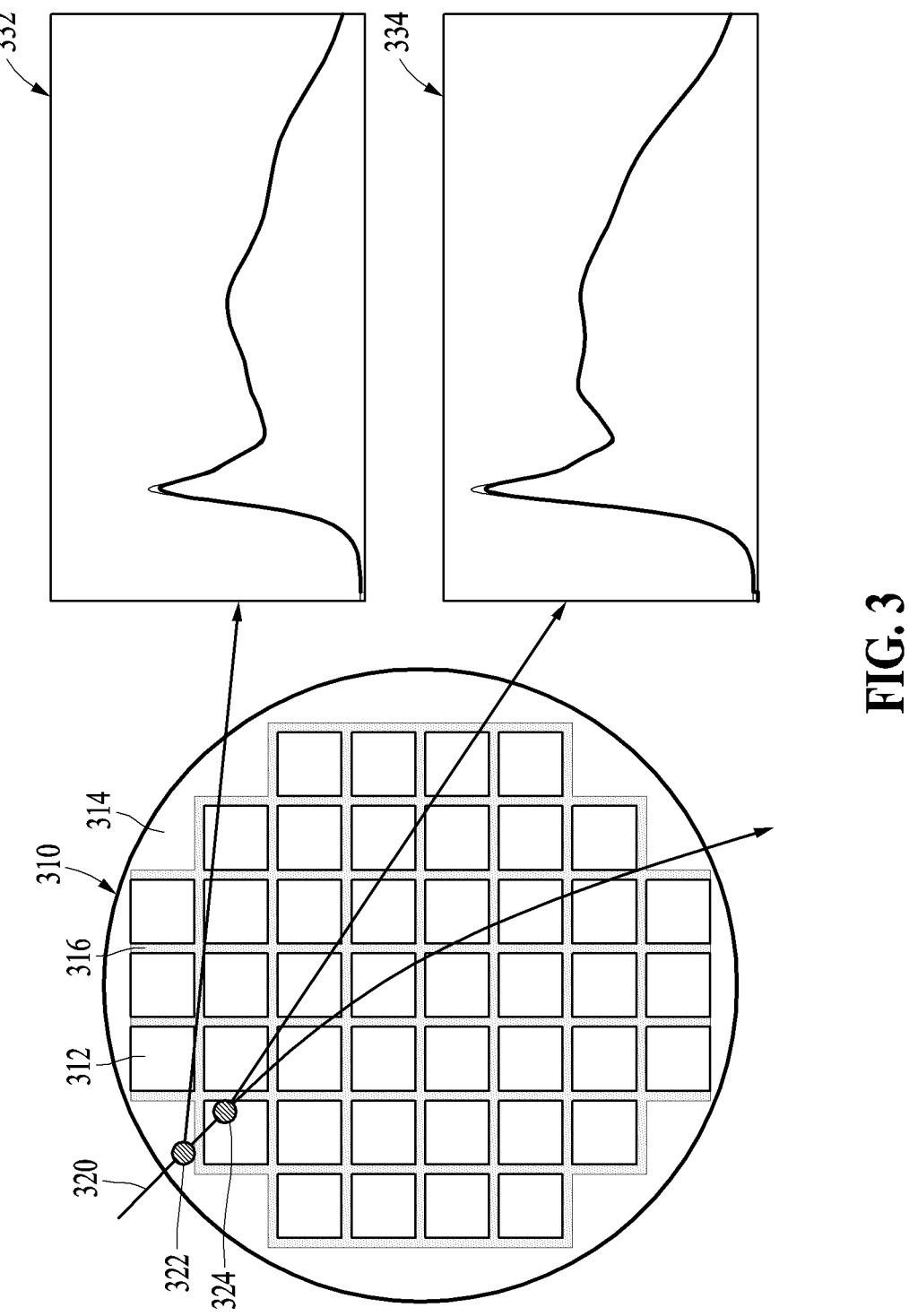
Figure 4:
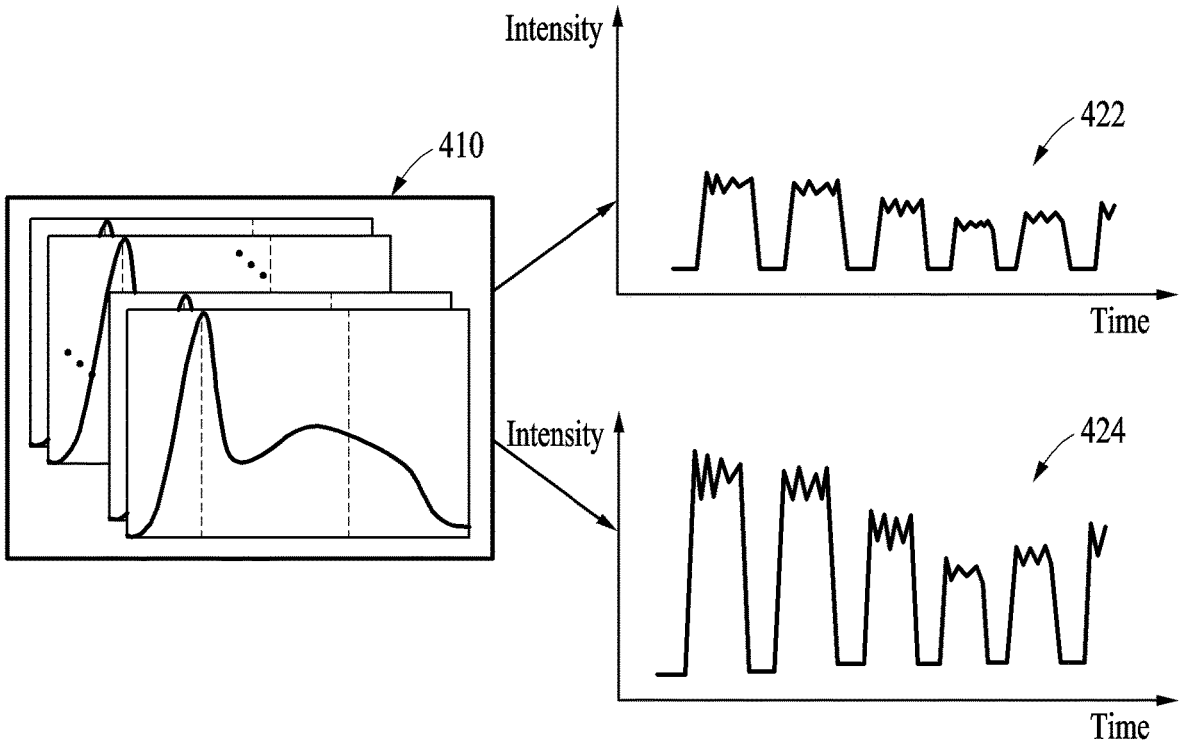
Figure 5:
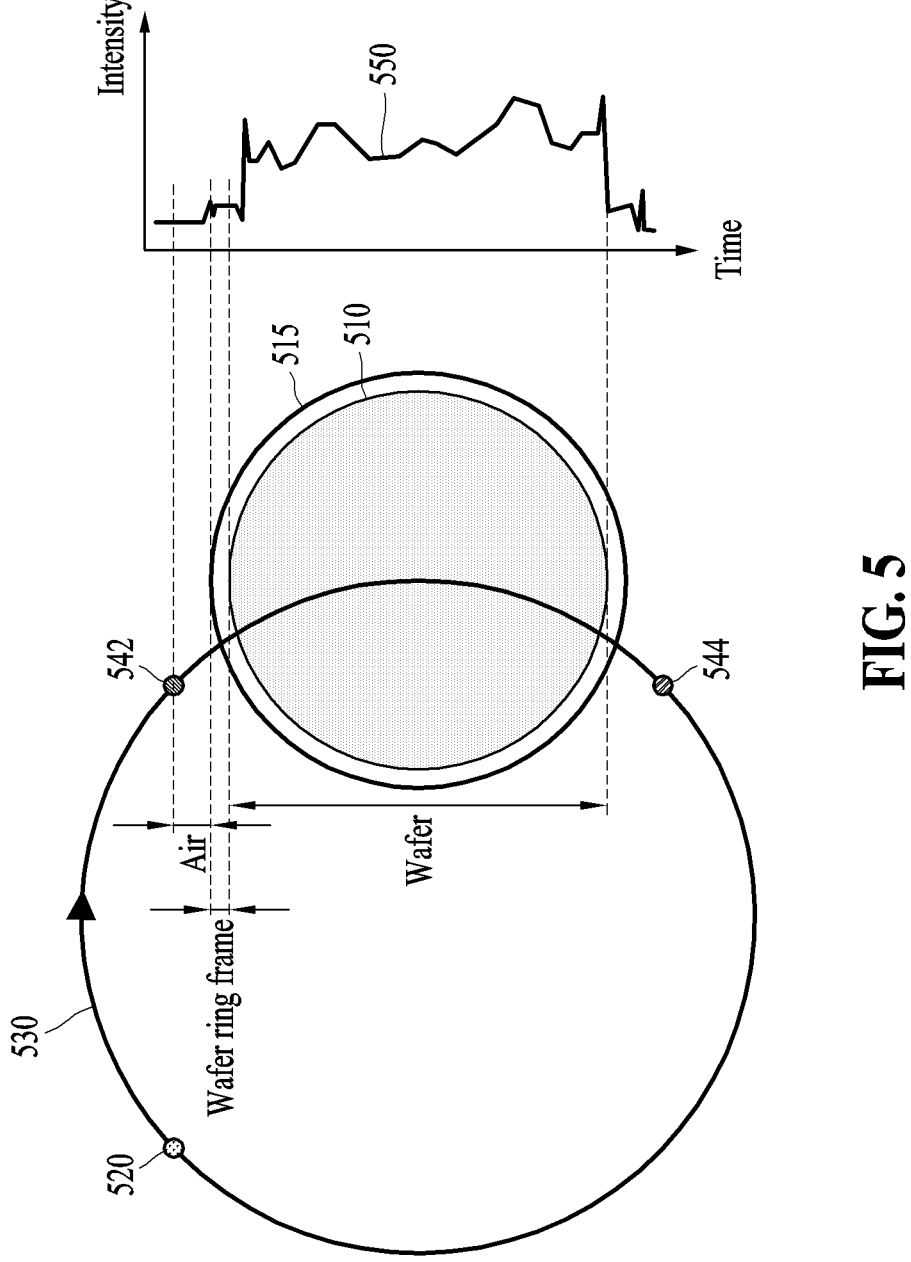
Figure 6:
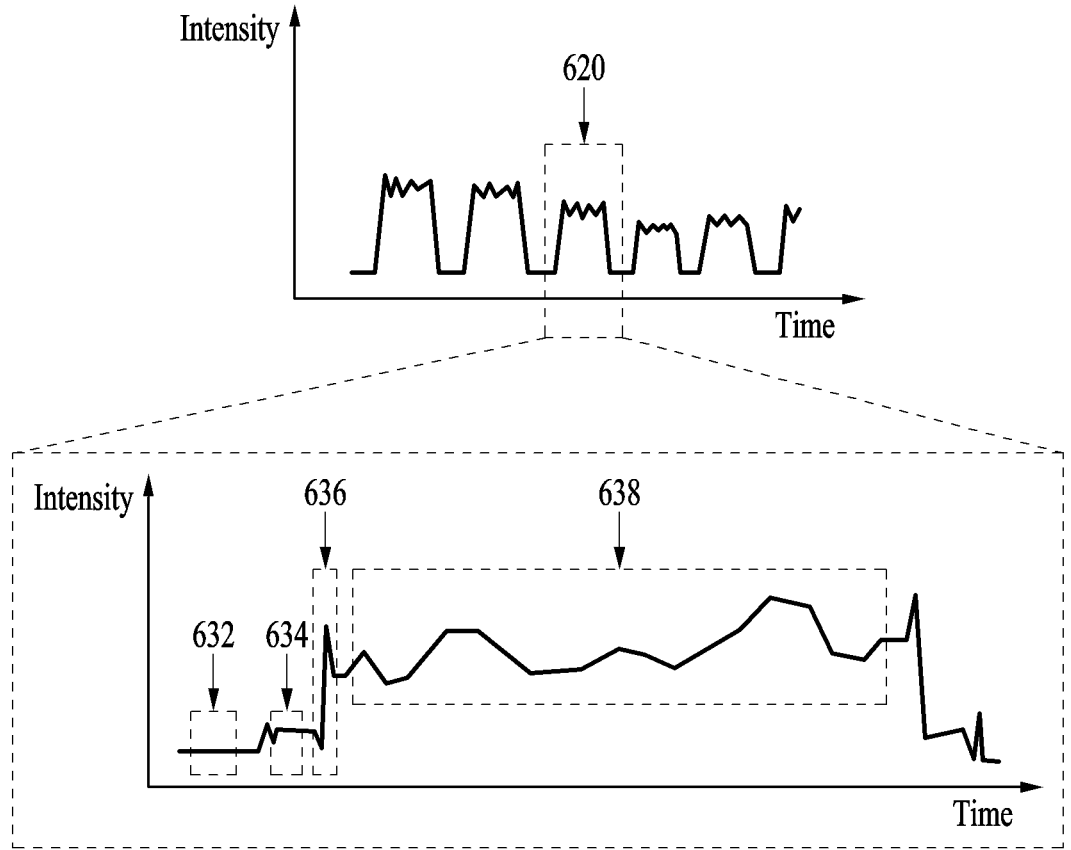
Figure 7A:
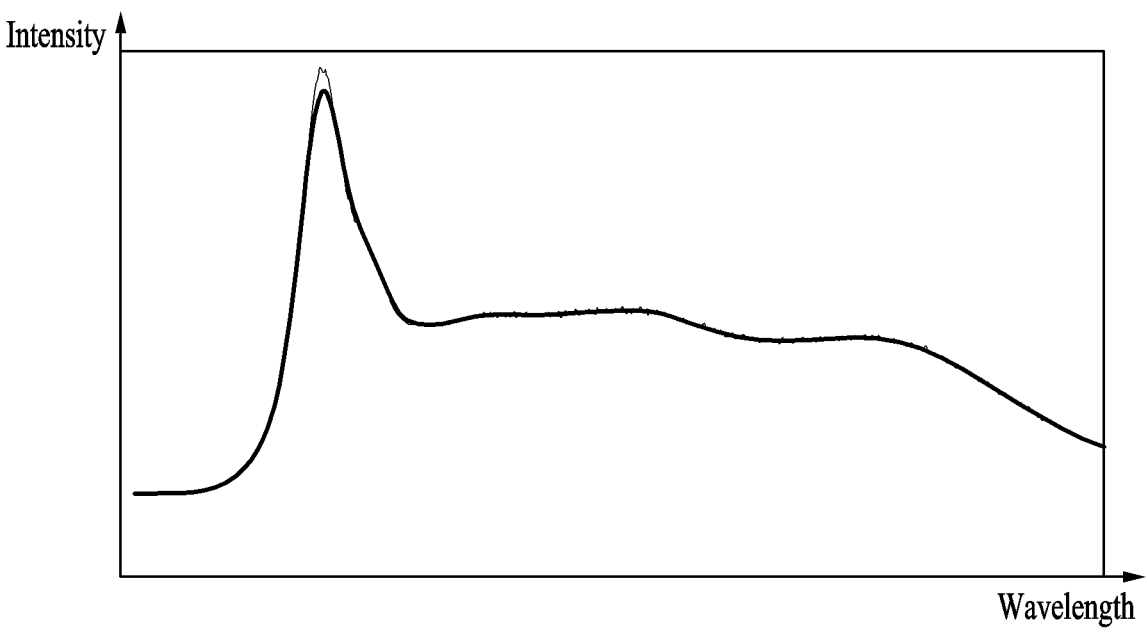
Figure 7B:
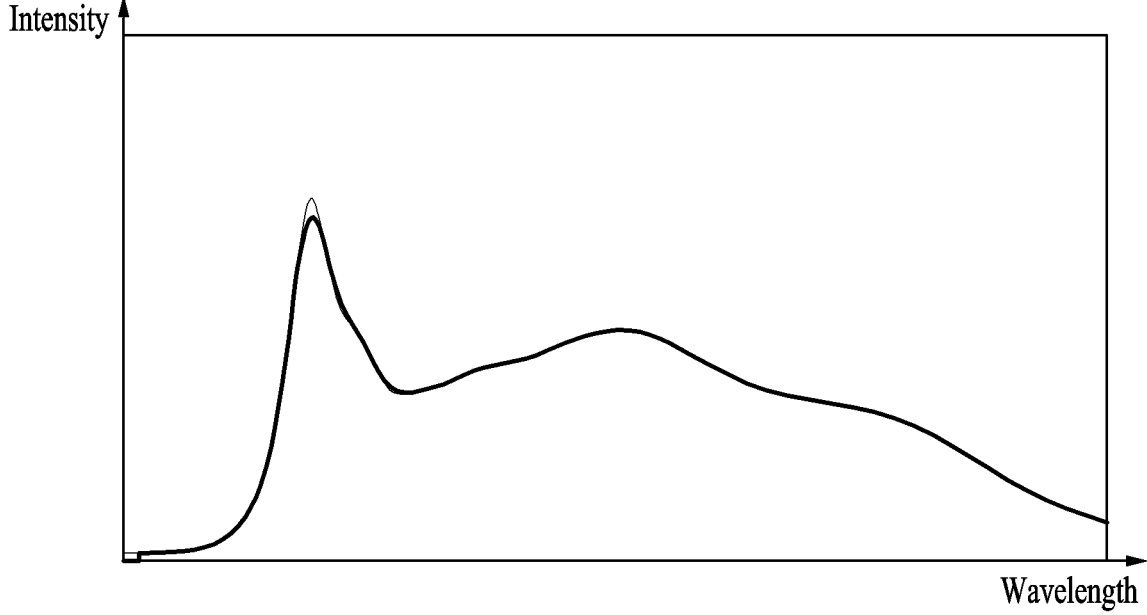
Figure 7C:
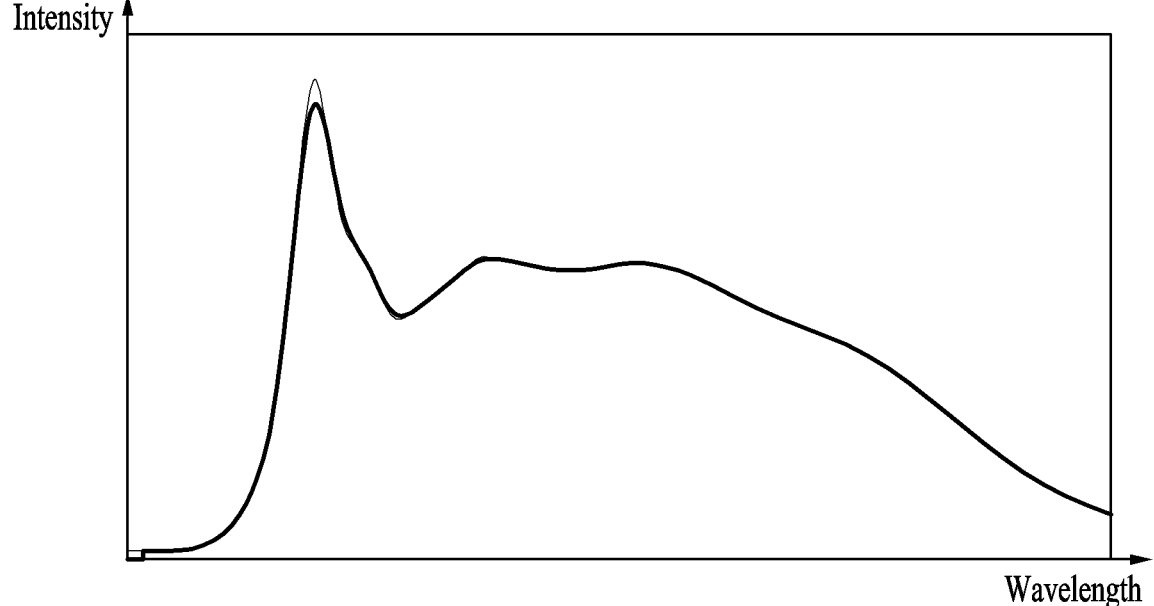
Figure 8:
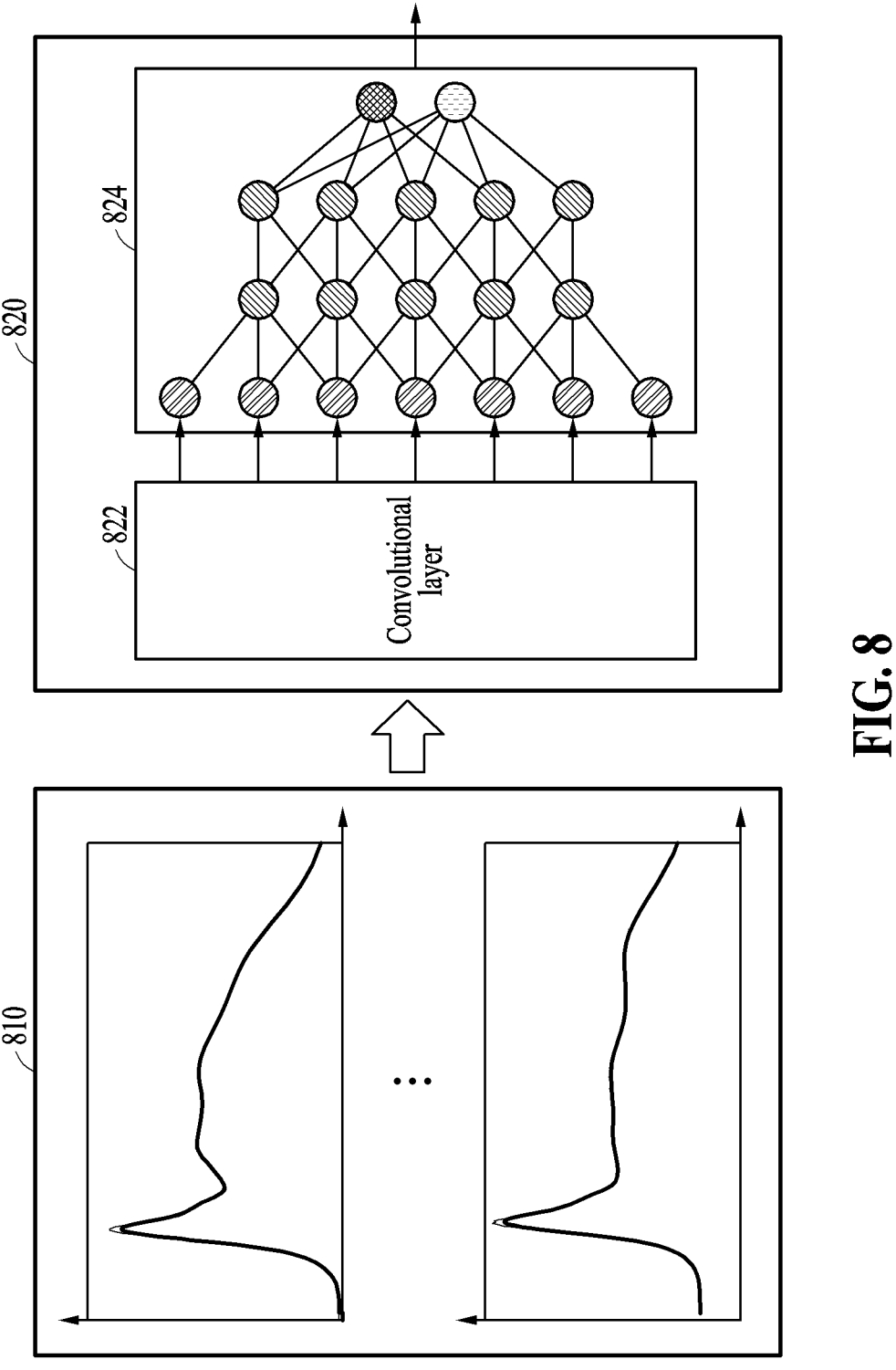
Figure 11:
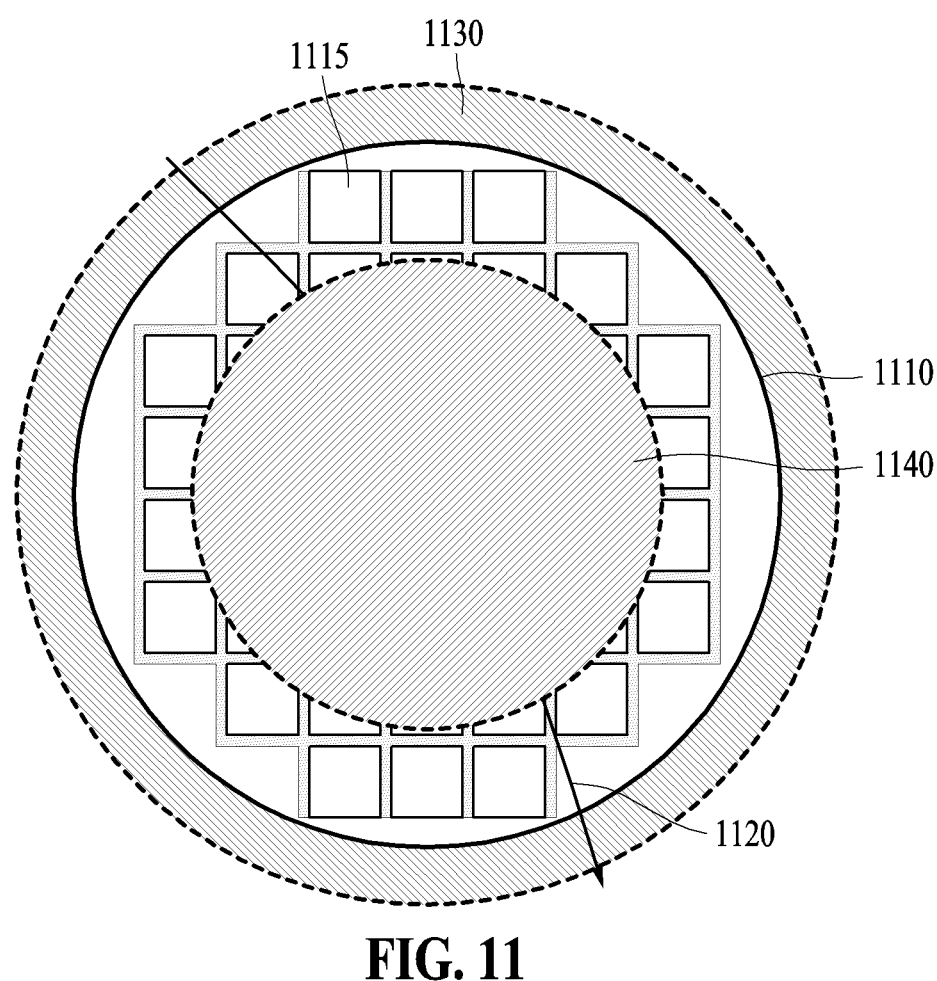
Figure 12:
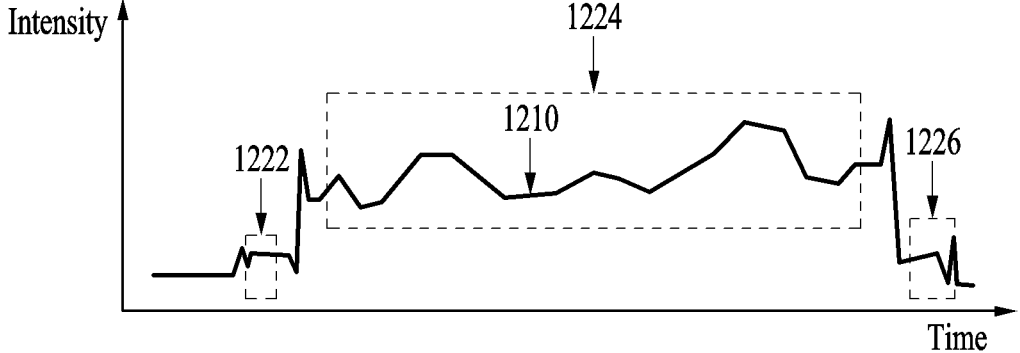

3 ciated from the following description of embodiments, taken in conjunction with the accompanying drawings of which:

FIG. 1 is a diagram for providing an overview of a process of discriminating a wafer region, according to an embodiment;

FIG. 2 is a diagram illustrating components of a wafer region discrimination apparatus, according to an embodiment;

FIG. 3 is a diagram illustrating examples of optical spectrum signals based on a measurement position of a probe, according to an embodiment;

FIG. 4 is a diagram illustrating signals in a predetermined wavelength band extracted from optical spectrum signals, according to an embodiment;

FIGS. 5 and 6 are diagrams illustrating a change in an optical spectrum signal based on a measurement position of a probe, according to an embodiment;

FIGS. 7A, 7B, and 7C are diagrams illustrating examples of optical spectrum signals obtained by a probe, according to an embodiment;

FIG. 8 is a diagram illustrating the structure of a region discrimination model, according to an embodiment;

FIG. 9 is a flowchart illustrating operations of a method of discriminating a wafer region, according to an embodiment;

FIG. 10 is a flowchart illustrating operations of a training method of training a region discrimination model, according to an embodiment; and FIGS. 11 and 12 are diagrams illustrating training data used to train a region discrimination model, according to an embodiment.

DETAILED DESCRIPTION

Hereinafter, embodiments are described in detail with reference to the accompanying drawings. However, various alterations and modifications may be made to the embodiments. Here, the embodiments are not meant to be limited by the descriptions of the present disclosure. The embodiments should be understood to include all changes, equivalents, and replacements within the idea and the technical scope of the disclosure.

The terminology used herein is for the purpose of describing particular embodiments only and is not to be limiting of the embodiments. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, components, or combinations thereof, but do not preclude the presence or addition of one or more other features, integers, steps, operations, elements, components, or combinations thereof.

Unless otherwise defined, all terms including technical and scientific terms used herein have the same meaning as commonly understood by one of ordinary skill in the art to which the embodiments belong. Terms defined in dictionaries generally used should be construed to have meanings matching with contextual meanings in the related art and are not to be construed as having an ideal or excessively formal meaning unless otherwise defined herein.

When describing the embodiments with reference to the accompanying drawings, like reference numerals refer to like components and a repeated description related thereto will be omitted. In the description of embodiments, detailed description of well-known related structures or functions will be omitted when it is deemed that such description will cause ambiguous interpretation of the present disclosure.

In addition, terms such as first, second, A, B, (a), (b), and the like may be used to describe components of the embodiments. These terms are used only for the purpose of discriminating one component from another component, and the nature, the sequences, or the orders of the components are not limited by the terms. It is to be understood that if a component is described as being "connected," "coupled" or "joined" to another component, the former may be directly "connected," "coupled," and "joined" to the latter or "connected", "coupled", and "joined" to the latter via another component.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Components included in an embodiment and components having a common function are described using the same names in other embodiments. Unless otherwise stated, the description of one embodiment may apply to other embodiments, and thus duplicated descriptions will be omitted.

Recently, there has been a trend toward larger chip sizes within wafers, and as chip sizes increase, the outer regions of a wafer without chips are gradually widening. If the distinction between regions with chips and regions without chips within a wafer region is not precise, the thickness measurement of the thin film of a wafer performed based on an optical sensor may be inaccurate. This inaccuracy in thickness measurement of the thin film of the wafer may lead to an increase in defect rates of chips positioned in the outer regions of the wafer. Therefore, there is a need for an enhanced discrimination technique for wafer regions to distinguish between regions (e.g., die regions) within the wafer in which structures (e.g., chips) are positioned and regions (e.g., non-die regions) in which structures are not positioned. By accurately distinguishing regions of the wafer from regions with chips within the wafer, the thickness of the thin film of the wafer may be more precisely measured. According to one or more embodiments described herein, provided are technical solutions that enable more accurate measurement of the regions of the wafer and the region within the wafer in which chips are located.

FIG. 1 is a diagram for providing an overview of a process of discriminating a wafer region, according to an embodiment.

Referring to FIG. 1, a wafer region discrimination apparatus 100 may discriminate (distinguish or identify) a region on a wafer 110 based on one or more optical spectrum signals 130 (or spectrum data) measured by a probe (not shown). In an embodiment, the wafer region discrimination apparatus 100 may determine a structure zone on the wafer 110 using a machine learning-based region discrimination model during a chemical mechanical polishing (CMP) process for the wafer 110. In an embodiment, the wafer region discrimination apparatus 100 may include a probe. According to an embodiment, the probe may be outside the wafer region discrimination apparatus 100. The wafer region discrimination apparatus 100 may obtain the one or more optical spectrum signals 130 in real time while optical equipment, such as a probe, polishes the wafer 110 and may identify a region within the wafer 110 where thickness measurement is desired based on the obtained one or more optical spectrum signals 130.

A probe including an optical sensor may obtain the optical spectrum signals 130 while moving along a predetermined movement trajectory 120. Light is emitted from a light source of the probe, the emitted light returns after being reflected by a medium, and the optical sensor may measure the reflected light. Optical spectrum signal measurement may be performed by the probe while the wafer 110 is in a rotating state. The optical spectrum signals 130 obtained by the probe may include optical spectrum signals in which signal values vary based on a thickness characteristic of the wafer 110. For example, the probe may obtain the optical spectrum signals 130 at multiple measurement positions 124 within a range from a start point 122 to an end point 126 while moving along the movement trajectory 120. For example, the optical sensor included in the probe may obtain an optical spectrum signal 132 at the measurement position 124, and at successive sampling positions reached, an optical spectrum signal corresponding to each of the sampling positions may be obtained. The measurement and collection of optical spectrum signals may start from the start point 122 and end when the end point 126 is reached.

The wafer 110 may correspond to a wafer region, and a region 115 (or R-ring region) corresponding to a wafer ring frame for fixing (or holding) a wafer may exist around the wafer 110. In an embodiment, the probe may obtain optical spectrum signals not only from a region within the wafer 110 but also from the region 115 corresponding to the wafer ring frame and an outer region (e.g., air region) of the region 115 corresponding to the wafer ring frame.

The one or more optical spectrum signals 130 obtained by the probe may be transmitted to the wafer region discrimination apparatus 100, and the wafer region discrimination apparatus 100 may discriminate a wafer region based on the received one or more optical spectrum signals 130. In an embodiment, the wafer region discrimination apparatus 100 may identify whether a current optical spectrum signal is obtained from a die region on a wafer in which a chip is disposed using a region discrimination model based on a neural network that uses the current optical spectrum signal obtained by the probe as an input. The region discrimination model may be, for example, a region discrimination model based on a convolutional neural network but is not limited thereto. The region discrimination model may be generated through a training process, and the process of training the region discrimination model is described in detail with reference to FIGS. 10 to 12.

In an embodiment, the wafer region discrimination apparatus 100 may identify whether the current optical spectrum signal is obtained from a non-die region on the wafer in which a chip is not disposed using the region discrimination model. The non-die region may include at least one of an edge region within the wafer in which a chip is not disposed and a scribe line region between die regions. In addition, the wafer region discrimination apparatus 100 may identify whether the current optical spectrum signal is obtained from the region 115 corresponding to the wafer ring frame for fixing a wafer or an air region outside the wafer ring frame using the region discrimination model.

Through the operations described above, the wafer region discrimination apparatus 100 may distinguish between the inner and outer regions of the wafer 110 and distinguish between the die and non-die regions within the wafer 110 more accurately. Accordingly, the boundaries between the region of the wafer 100 and other regions may be accurately identified, allowing a zone in which the thickness of the wafer 110 may be measured to be expanded. The quality of data used to measure the thickness of the wafer 110 may be improved, increasing the accuracy of the measurement of the thickness of the wafer 110.

FIG. 2 is a diagram illustrating components of a wafer region discrimination apparatus, according to an embodiment.

Referring to FIG. 2, the wafer region discrimination apparatus 100 may include a probe 210, a processor 220, and a memory 230. In some embodiments, at least one (e.g., the probe 210) of these components of the wafer region discrimination apparatus 100 may be omitted, or one or more other components (e.g., a wafer thickness estimation apparatus 240 and a storage module) may be added to the wafer region discrimination apparatus 100.

The probe 210 may include an optical sensor and obtain optical spectrum signals in which signal values vary based on a thickness characteristic of a wafer at a plurality of positions on the wafer. While moving along a designated movement trajectory, the probe 210 may obtain an optical spectrum signal by measuring reflected light, which is emitted from a light source and returns after being reflected from a medium. The optical spectrum signals obtained by the probe 210 may include signals obtained as light in a plurality of wavelength bands reflects off the wafer.

The memory 230 may store information necessary for the processor 220 to perform a processing operation. For example, the memory 230 may store commands executable by the processor 220, an optical spectrum signal obtained by the probe 210, sensor data from other sensors, and the like. The memory 230 may include a volatile memory, such as random-access memory (RAM), dynamic RAM (DRAM), and static RAM (SRAM), and/or a non-volatile memory known in the art such as flash memory.

The processor 220 may control the overall operation of the wafer region discrimination apparatus 100. The processor 220 may include one or more processors. The processor 220 may include, for example, general-purpose processors such as a central processing unit (CPU), an application processor (AP), and a digital signal processor (DSP), or a neural network processing unit (NPU).

The processor 220 may perform operations of the wafer region discrimination apparatus 100 described herein by executing the commands stored in the memory 230. In an embodiment, when the commands stored in the memory 230 and executable by the processor 220 are executed by the processor 220, the processor 220 may distinguish between types of regions respectively corresponding to positions of the wafer using a plurality of optical spectrum signals and a region discrimination model. The region discrimination model may be, for example, a region discrimination model based on a convolutional neural network.

In an embodiment, the processor 220 may identify whether a current optical spectrum signal is obtained from a die region on the wafer in which a chip is disposed using a region discrimination model based on a neural network that uses the current optical spectrum signal obtained by the probe as an input.

In an embodiment, the processor 220 may identify whether the current optical spectrum signal is obtained from a non-die region on the wafer in which a chip is not disposed using the region discrimination model. The non-die region may include at least one of an edge region within the wafer in which a chip is not disposed and a scribe line region between die regions. In an embodiment, the region discrimination model may discriminate a first signal region corresponding to a die region and a second signal region corresponding to a non-die region from a signal of a predetermined wavelength extracted from optical spectrum signals obtained along a movement trajectory of the probe.

In an embodiment, the processor 220 may identify whether the current optical spectrum signal is obtained from a region (a region in which a wafer ring frame is positioned) corresponding to the wafer ring frame for fixing the wafer using the region discrimination model. In addition, the processor 220 may identify whether the current optical spectrum signal is obtained from an air region outside the wafer ring frame using the region discrimination model.

In an embodiment, an optical spectrum signal obtained from a die region may be transmitted to the wafer thickness estimation apparatus 240, which estimates the thickness of a thin film of the wafer, and the wafer thickness estimation apparatus 240 may estimate the thickness of the wafer based on the received optical spectrum signal. According to an embodiment, the wafer region discrimination apparatus 100 may function as the wafer thickness estimation apparatus 240 and estimate the thickness of the wafer based on the optical spectrum signal obtained from the die region. For example, the processor 220 may estimate the thickness of the thin film of the wafer based on the current optical spectrum signal when it is determined that the current optical spectrum signal is obtained from the die region. In this case, the processor 220 may estimate the thickness of the thin film of the wafer using a wafer thickness estimation model based on a neural network that uses the current optical spectrum signal as an input. The thickness of the thin film of the wafer may be estimated based on the die region rather than the non-die region of the wafer, increasing the accuracy of the estimation of the thickness of the thin film of the wafer. With an increased accuracy in estimating the thickness of the thin film, it may become possible to adjust the rate of thin film scraping more accurately and precisely for each zone of the wafer, reducing the defect rate of chips positioned in the outer portion of the wafer.

FIG. 3 is a diagram illustrating examples of optical spectrum signals based on a measurement position of a probe, according to an embodiment.

Referring to FIG. 3, the inner region of the water 310 may be divided into die regions 312 in which chips are disposed and non-die regions in which the chips are not disposed. The non-die region may include an edge region 314 within the wafer 310 in which chips are not disposed and a scribe line region 316 between the die regions 312. The die regions 312 may include, for example, a plurality of chips arranged in rows and columns. The die regions 312 may be separated from each other by the scribe line region 316, and an individual chip within the wafer 310 may include a circuit. Dies may have a shape of a chip before being cut from the wafer 310 and may be separated from each other through the cutting process.

A probe may obtain optical spectrum signals through an optical sensor while moving along a movement trajectory 320 that traverses the region on the wafer 310. For example, an optical spectrum signal 332 may be obtained at a measurement position 322 on the movement trajectory 320, and an optical spectrum signal 334 may be obtained at a measurement position 324. The optical spectrum signal 332 is measured in a non-die region of the wafer 310, and the optical spectrum signal 334 is measured in a die region of the wafer 310. In both the optical spectrum signal 332 and the optical spectrum signal 334, the x-axis represents the wavelength of a signal, while the y-axis represents the intensity of a signal. Optical spectrum signals measured in a non-die region (e.g., the outer region and the scribe line region of the wafer in which chips are not disposed) may act as unnecessary noise in measuring the thickness of the wafer 310.

FIG. 4 is a diagram illustrating signals in a predetermined wavelength band extracted from optical spectrum signals, according to an embodiment.

FIG. 4 illustrates an example of optical spectrum signals 410 obtained by a probe. The intensity of light reaching an optical sensor included in the probe is related to the thickness of a wafer and a material that the light reflects off. For example, when the material of a thin film of the wafer changes, the optical characteristic of reflected light based on thickness may vary. The shape of the optical spectrum signals 410 may vary based on the characteristic of a region where light is reflected. A graph 422 represents a signal component of a first wavelength (e.g., 551.51 nanometers (nm)) from the optical spectrum signals 410, and a graph 424 represents a signal component of a second wavelength (e.g., 454.49 nm) from the optical spectrum signals 410. In the graphs 422 and 424, the x-axis represents time and the y-axis represents intensity.

FIGS. 5 and 6 are diagrams illustrating a change in an optical spectrum signal based on a measurement position of a probe, according to an embodiment.

Referring to FIG. 5, a probe 520 may obtain optical spectrum signals through an optical sensor within a range from a start point 542 to an end point 544 while moving along a movement trajectory 530. For example, there are sampling positions with a predetermined time interval (or predetermined distance) within the range from the start point 542 to the end point 544, and the probe 520 may obtain an optical spectrum signal at each of the sampling positions. The probe 520 may obtain the optical spectrum signals by rotating several times along the movement trajectory 530.

In an embodiment, the start point 542 on the movement trajectory 530 may start from an air region. A sampling position progresses over time from an air region, to a region 515 corresponding to a wafer ring frame, to a wafer region 510, to the region 515 corresponding to the wafer ring frame, and then to the air region, reaching the end point 544. When the end point 544 is reached, the process of obtaining an optical spectrum signal may be terminated.

A graph 550 illustrates the change in intensity of an optical spectrum signal measured at the sampling positions over time, ranging from the start point 542 to the end point 544. Referring to the graph 550, the intensity of the optical spectrum signal remains consistent in the air region but then increases in the region 515 corresponding to the wafer ring frame before further increasing in the wafer region 510. Furthermore, the intensity of the optical spectrum signal rapidly fluctuates between the region 515 corresponding to the wafer ring frame and the wafer region 510. Based on these region-specific characteristics of an optical spectrum signal, the inner and outer regions of a wafer may be effectively distinguished between each other. A region discrimination model described herein is a model that learns these region-specific characteristics of an optical spectrum signal. Due to varying light reflectance or absorbance based on the surface condition of a wafer, comparing the shapes or forms of optical spectrum signals on the surface of the wafer measured through the probe enables an effective distinction between the inner and outer regions of the wafer, as well as the die and non-die regions within the wafer.

FIG. 6 illustrates a graph 610 showing a signal component of a predetermined wavelength (e.g., 551.51 nm) from optical spectrum signals obtained by a probe. The signal component may exhibit periodicity based on the movement cycle (or rotation cycle) of the probe. Referring to an enlarged graph of a predetermined region 620 of the signal component, the signal component may include a signal component 632 measured in an air region, a signal component 634 measured in a region corresponding to a wafer ring frame, a signal component 636 measured in a non-die region within the inner region of a wafer, and a signal component 638 measured in a die region within the inner region of the wafer.

FIGS. 7A, 7B, and 7C are diagrams illustrating examples of optical spectrum signals obtained by a probe, according to an embodiment.

FIG. 7A illustrates an example of an optical spectrum signal measured in an air region or a region corresponding to a wafer ring frame. FIG. 7B illustrates an example of an optical spectrum signal measured in a non-die region within the inner region of a wafer, and FIG. 7C illustrates an example of an optical spectrum signal measured in a die region within the inner region of the wafer. The shapes of the optical spectrum signals respectively measured in the air region (or a region corresponding to the wafer ring frame), non-die region, and die region are distinctly differentiated from each other. Thus, the inner and outer regions of the wafer, as well as the die and non-die regions, may be distinguished from one another based on the shapes of the optical spectrum signals.

FIG. 8 is a diagram illustrating the structure of a region discrimination model, according to an embodiment.

Referring to FIG. 8, a region discrimination model 820 according to an embodiment may be based on a convolutional neural network including a convolutional layer 822, a hidden layer, and an output layer 824. An optical spectrum signal 810 obtained by a probe may be input into the region discrimination model 820, and the convolutional layer 822 may extract features from the input optical spectrum signal 810. The hidden layer and the output layer 824 may discriminate a region corresponding to the optical spectrum signal based on the features extracted by the convolutional layer 822. The hidden layer may be, for example, a fully connected layer. The hidden layer may be connected to the output layer, and the convolutional layer 822, the hidden layer, and the output layer 824 may each include a plurality of artificial neurons (or nodes). The structure of the region discrimination model 820 may be modified in various ways. In another embodiment, several optical spectrum signals obtained by the probe may be input into the region discrimination model 820 at once.

The region discrimination model 820 may output a probability value or score indicating the likelihood that a currently input optical spectrum signal corresponds to an optical spectrum signal measured in a die region. In another example, the region discrimination model 820 may also output a probability value or score indicating the likelihood that currently input optical spectrum signals respectively correspond to an air region, a region corresponding to a wafer ring frame, a non-die region, and a die region.

FIG. 9 is a flowchart illustrating operations of a method of discriminating a wafer region, according to an embodiment. The method according to an embodiment may be performed by a wafer region discrimination apparatus (e.g., the wafer region discrimination apparatus 100 of FIGS. 1 and 2) described herein.

Referring to FIG. 9, in operation 910, the wafer region discrimination apparatus may obtain optical spectrum signals in which signal values vary based on a thickness characteristic of a wafer at a plurality of positions on the wafer through a probe. The probe may obtain the optical spectrum signals by measuring reflected light, which is emitted from a light source and returns after being reflected by a medium (e.g., air, a wafer ring frame, or a wafer).

In operation 920, the wafer region discrimination apparatus may discriminate a wafer region using a region discrimination model based on a neural network that uses a current optical spectrum signal obtained by the probe as an input. In an embodiment, the wafer region discrimination apparatus may identify whether the current optical spectrum signal is obtained from a die region on the wafer in which a chip is disposed using the region discrimination model. In addition, the wafer region discrimination apparatus may identify whether the current optical spectrum signal is obtained from a non-dire region on the wafer in which a chip is not disposed using the region discrimination model. The wafer region discrimination apparatus may identify whether the current optical spectrum signal is obtained from a region corresponding to the wafer ring frame for fixing the wafer using the region discrimination model. In addition, the wafer region discrimination apparatus may identify whether the current optical spectrum signal is obtained from an air region outside the wafer ring frame using the region discrimination model.

In operation 930, the wafer region discrimination apparatus may further perform an operation of estimating the thickness of a thin film of the wafer based on the optical spectrum signal. The wafer region discrimination apparatus may estimate the thickness of the thin film of the wafer based on the current optical spectrum signal when it is determined that the current optical spectrum signal is obtained from the die region. In an embodiment, the wafer region discrimination apparatus may estimate the thickness of the thin film using a wafer thickness estimation model based on a neural network that is trained to output an estimated thin film thickness value of the wafer by using the optical spectrum signal as an input. The wafer thickness estimation model may be generated through a training process. During the training process, an optical spectrum signal corresponding to a predetermined thin film thickness may be input into the wafer thickness estimation model, and the process of adjusting parameters (e.g., a connection weight and a bias) included in the wafer thickness estimation model may be repeatedly performed, aiming to bring an estimated thin film thickness value output by the wafer thickness estimation model closer to an actual thin film thickness value. Performing this training process targeting various thin film thicknesses of the wafer may result in the generation of the wafer thickness estimation model.

FIG. 10 is a flowchart illustrating operations of a training method of training a region discrimination model, according to an embodiment. The training method may be performed by a training apparatus including a processor and a memory.

Referring to FIG. 10, in operation 1010, the training apparatus may select wavelengths having significant wafer region features (e.g., intensity differences) from among lights.

In operation 1020, the training apparatus may generate training data based on the selected wavelengths. In an embodiment, the training data may be generated by a probability density function and/or a differential function. The training apparatus may generate the training data by applying the selected wavelengths to the probability density function or differential function. Optical spectrum data for a die region, which is a target for thickness measurement of a wafer at an inner position within a wafer region, may be generated as the training data. Based on the waveform of the generated training data, function parameters of the probability density function and/or differential function that generate the training data may be altered.

The key aspect of algorithms for generating training data is to utilize data that falls outside the range to be demarcated. According to an embodiment, the algorithms for generating training data may include techniques such as: 1) using parameters (e.g., angular velocity of a probe, a position in which a probe is installed, etc.) of hardware to track a trajectory of the probe and generate training data; 2) installing a separate data measurement apparatus beneath the wafer to obtain training data; 3) generating training data using optical data obtained in advance while the wafer is in a standby state; 4) generating training data using a function that uses differences in light intensity as a variable; and 5) generating training data using the probability density function.

In operation 1030, the training apparatus may train a region discrimination model based on the generated training data. The training apparatus may input the training data into the region discrimination model, define the difference between an output of the region discrimination model and an actual intended output through a loss function, and update parameters (e.g., the connection weight between artificial neurons and bias) of the region discrimination model to reduce the loss value of the loss function. In the process of updating the parameters, an error backpropagation technique may be used. The training apparatus may generate the region discrimination model that is gradually updated in a desired way by continuously performing this process on each piece of training data.

FIGS. 11 and 12 are diagrams illustrating training data used to train a region discrimination model, according to an embodiment.

FIG. 11 illustrates die regions 1115 in which chips are disposed on a wafer 1110 and an outer region 1130 of the wafer 1110. The outer region 1130 may include, for example, a region corresponding to a wafer ring frame and/or an air region. Among pieces of optical spectrum data measured along a movement trajectory 1120 of a probe, a region 1140 including the die regions 1115 and the outer region 1130 of the wafer 1110 may be regions used to train a region discrimination model. The pieces of data respectively corresponding to the regions (e.g., 1130 and 1140) may be used as training data to train the region discrimination model.

FIG. 12 illustrates the change in intensity over time of a signal 1210 obtained along a movement trajectory of a probe. From the obtained signal, a signal 1224 corresponding to a die region of a wafer and signals 1222 and 1226 corresponding to an outer region of the wafer may be used as training data for training a region discrimination model.

The methods according to the embodiments may be recorded in non-transitory computer-readable media including program instructions to implement various operations of the embodiments. The media may also include, alone or in combination with the program instructions, data files, data structures, and the like. The program instructions recorded on the media may be those specially designed and constructed for the purposes of embodiments, or they may be of the kind well-known and available to one of ordinary skill in the computer software arts. Examples of non-transitory computer-readable media include magnetic media such as hard disks, floppy disks, and magnetic tape; optical media such as CD-ROM discs and DVDs; magneto-optical media such as floptical disks; and hardware devices that are specially configured to store and perform program instructions, such as read-only memory (ROM), RAM, flash memory, and the like. Examples of program instructions include both machine code, such as produced by a compiler, and files containing higher-level code that may be executed by the computer using an interpreter. The above-described hardware devices may be configured to act as one or more software modules in order to perform the operations of the embodiments, or vice versa.

The software may include a computer program, a piece of code, an instruction, or some combination thereof, to independently or collectively instruct or configure the processing device to operate as desired. Software and/or data may be embodied permanently or temporarily in any type of machine, component, physical or virtual equipment, or computer storage medium or device capable of providing instructions or data to or being interpreted by the processing device. The software also may be distributed over network-coupled computer systems so that the software is stored and executed in a distributed fashion. The software and data may be stored by one or more non-transitory computer-readable recording mediums.

Although the embodiments have been described with reference to the limited drawings, one of ordinary skill in the art may apply various technical modifications and variations based thereon. For example, suitable results may be achieved if the described techniques are performed in a different order and/or if components in a described system, architecture, device, or circuit are combined in a different manner and/or replaced or supplemented by other components or their equivalents.

Therefore, other implementations, other embodiments, and equivalents to the claims are also within the scope of the following claims.

What is claimed is:

1. A wafer region discrimination apparatus comprising:
a probe comprising an optical sensor and configured to obtain optical spectrum signals of which signal values vary based on a thickness characteristic of a wafer at a plurality of positions on the wafer; and
a processor configured to identify whether a current optical spectrum signal obtained by the probe is obtained from a die region on the wafer in which a chip is disposed or from a non-die region on the wafer in which the chip is not disposed using a region discrimination model based on a neural network that uses the current optical spectrum signal obtained by the probe as an input, wherein the region discrimination model is trained using training data which include optical spectrum signals corresponding to the die region of the wafer and optical spectrum signals corresponding to the non-die region of the wafer.

2. The wafer region discrimination apparatus of claim 1, wherein the non-die region comprises at least one of an edge region in the wafer in which the chip is not disposed and a scribe line region between die regions.

3. The wafer region discrimination apparatus of claim 1, wherein the processor is configured to identify whether the current optical spectrum signal is obtained from a region corresponding to a wafer ring frame for fixing the wafer using the region discrimination model.

4. The wafer region discrimination apparatus of claim 3, wherein the processor is configured to identify whether the current optical spectrum signal is obtained from an air region outside the wafer ring frame using the region discrimination model.

5. The wafer region discrimination apparatus of claim 1, wherein the processor is configured to estimate a thickness of a thin film of the wafer based on the current optical spectrum signal when it is determined that the current optical spectrum signal is obtained from the die region.

6. The wafer region discrimination apparatus of claim 5, wherein the processor is configured to estimate the thickness of the thin film of the wafer using a wafer thickness estimation model based on a neural network that uses the current optical spectrum signal as an input.

7. The wafer region discrimination apparatus of claim 1, wherein the processor is configured to discriminate a type of a region corresponding to each of the positions of the wafer using the plurality of optical spectrum signals and the region discrimination model.

8. The wafer region discrimination apparatus of claim 1, wherein the optical spectrum signals obtained by the probe comprise signals obtained as light in a plurality of wavelength bands reflects off the wafer.

9. The wafer region discrimination apparatus of claim 1, wherein the region discrimination model is configured to discriminate a first signal region corresponding to a die region and a second signal region corresponding to a non-die region from a signal of a predetermined wavelength extracted from optical spectrum signals obtained along a movement trajectory of the probe.

10. The wafer region discrimination apparatus of claim 1, wherein the region discrimination model is a region discrimination model based on a convolutional neural network.

11. A method of discriminating a wafer region, the method comprising:

obtaining optical spectrum signals of which signal values vary based on a thickness characteristic of a wafer at a plurality of positions on the wafer through a probe; and identifying whether a current optical spectrum signal obtained by the probe is obtained from a die region on the wafer in which a chip is disposed or from a non-die region on the wafer in which the chip is not disposed using a region discrimination model based on a neural network that uses the current optical spectrum signal obtained by the probe as an input, wherein the region discrimination model is trained using training data which include optical spectrum signals corresponding to the die region of the wafer and optical spectrum signals corresponding to the non-die region of the wafer.

12. The method of claim 11, wherein the identifying of whether the current optical spectrum signal is obtained from the die region on the wafer in which the chip is disposed comprises identifying whether the current optical spectrum signal is obtained from a region corresponding to a wafer ring frame for fixing the wafer using the region discrimination model.

13. The method of claim 11, wherein the identifying of whether the current optical spectrum signal is obtained from the die region on the wafer in which the chip is disposed comprises identifying whether the current optical spectrum signal is obtained from an air region outside the wafer ring frame using the region discrimination model.

14. The method of claim 11, further comprising:

estimating a thickness of a thin film of the wafer based on the current optical spectrum signal when it is determined that the current optical spectrum signal is obtained from the die region.

15. The method of claim 11, wherein the region discrimination model is configured to discriminate a first signal region corresponding to a die region and a second signal region corresponding to a non-die region from a signal of a predetermined wavelength extracted from optical spectrum signals obtained along a movement trajectory of the probe.

* * * * *